United States Patent [19]

Scarzello et al.

[11] Patent Number: 5,440,232
[45] Date of Patent: Aug. 8, 1995

[54] SYSTEM FOR MONITORING AND ANALYZING FIELD ENERGY EXPOSURE

[75] Inventors: John F. Scarzello, Columbia; Adam C. Feaga, Clarksville; Daniel S. Lenko, Monrovia, all of Md.

[73] Assignee: The United States of America as represented by the Secretary of the Navy, Washington, D.C.

[21] Appl. No.: 186,711

[22] Filed: Dec. 6, 1993

[51] Int. Cl.⁶ .............................................. G01R 33/02
[52] U.S. Cl. ..................................... 324/247; 327/510
[58] Field of Search ............... 324/247, 244, 258, 260; 328/150, 151; 307/309; 364/576

[56] References Cited

U.S. PATENT DOCUMENTS

| | | | |
|---|---|---|---|
| 3,639,841 | 2/1972 | Richardson | 325/363 |
| 4,495,467 | 1/1985 | Kuno et al. | 324/247 |
| 4,591,787 | 5/1986 | Hoenig | 324/248 |
| 4,635,207 | 1/1987 | Payne | 324/247 |
| 4,659,984 | 4/1987 | Doss | 324/95 |
| 4,805,232 | 2/1989 | Ma | 455/291 |
| 4,913,153 | 4/1990 | Hagmann et al. | 128/653 R |
| 5,020,538 | 6/1991 | Morgan et al. | 128/653 R |
| 5,134,370 | 7/1992 | Jefferts et al. | 324/247 |
| 5,150,051 | 9/1992 | Freidman et al. | 324/258 |
| 5,151,649 | 9/1992 | Heroux | 324/127 |
| 5,256,960 | 10/1993 | Novini | 324/247 |
| 5,311,130 | 5/1994 | Bill et al. | 324/258 |
| 5,316,634 | 5/1994 | McLeod | 324/247 |

Primary Examiner—Sandra L. O'Shea
Assistant Examiner—Roger Phillips
Attorney, Agent, or Firm—Jacob Shuster

[57] ABSTRACT

A portable electromagnetic field exposure dosimeter includes a triaxial ferrite-loaded coil sensor, a group of amplifiers and bandpass filters, a data control board, and a computer. The triaxial sensor receives electromagnetic radiation along three orthogonal axes for measurement which is channelled through a group of amplifiers and then bandpass filtered into three frequency signal ranges. One frequency range corresponds to exposure at 60 Hz and two of its harmonics. The second frequency range corresponds to high frequency pulsed energy. The third frequency range reflects body motion of a tested individual. The data control board converts such filtered signals into digital code and controls the flow of the converted data to random access memory and to the computer. The computer performs a Fast Fourier Transform on the converted data from the 60 Hz frequency range and then stores or displays the analyzed data as a function of frequency and time. The computer also stores or displays the data from the other two frequency ranges.

3 Claims, 6 Drawing Sheets

SYSTEM FOR MONITORING AND ANALYZING FIELD ENERGY EXPOSURE

FIELD ENERGY EXPOSURE

The present invention relates generally to apparatus and method for monitoring ambient conditions such as potentially dangerous electromagnetic fields, and more particularly to a portable device and method for measuring, processing, and storing data quantifying exposure to such ambient conditions.

BACKGROUND OF THE INVENTION

Concern about adverse health effects caused by potentially dangerous ambient electromagnetic radiation continues to grow. Such concern persists partially because recent scientific studies indicate a link between exposure to ambient electromagnetic fields and cancerous disease. For instance, prolonged exposure to electromagnetic radiation from electric power lines may cause leukemia. These studies however lack a strong nexus between data indicating the extent of exposure to an electromagnetic field and the corresponding health conditions of the exposed person for example. Accordingly, a device which is more suitable to measure and record exposure to ambient energy fields and activities therein over an extended period of time is needed to improve the accuracy of these studies.

Related art includes U.S. Pat. No. 4,659,984 to Doss, which discloses a passive, integrating electromagnetic radiation power dosimeter. The dosimeter includes an antenna for receiving and interacting with incident electromagnetic radiation, a diode for rectifying the alternating voltage generated by the antenna, a network for generating a current proportional to the square of the direct current voltage produced in the rectification process, an electrochemical storage cell for producing an integrated response, and a voltage measuring device for measuring the integrated response. The dosimeter as disclosed in the Doss patent has several shortcomings. First, the receiving antenna of Doss does not distinguish the electromagnetic radiation it receives into three different axes or into different frequency ranges. Doss also does not convert the detected electromagnetic radiation into a form of data which can be easily read and analyzed by a computer in terms of exposure at regular intervals. Instead, a cumulative dose type of data is provided according to the Doss patent. Further, Doss does not measure or store the activity of a person handling or wearing the dosimeter.

Other related art includes U.S. Pat. No. 5,134,370 to Jefferts et al. The Jefferts et al. patent discloses an apparatus for detecting a magnetic tag implanted in an organism. The apparatus has a group of magnetic field detecting coils which have outputs balanced against one another in an uniform magnetic field. Such coils are moved past a stationary specimen to detect a different magnetic field, and the apparatus then generates a signal in response to the presence of an additional magnetic field. The apparatus disclosed in the Jefferts et al. patent is basically a metal detector which concentrates more on simple detection of a change in the magnetic field rather than measuring and storing data of electromagnetic radiation over an extended period.

Related art also includes U.S. Pat. No. 5,151,649 to Heroux, which discloses a portable instrument for measuring current in straight conductors. The instrument comprises a pair of triaxially-oriented magnetic flux density sensors. The instrument also comprises a multiplexer-ADC electronic circuit, a microprocessor, and a display unit. The Heroux patent focuses on accurate measurement and display of the electric current within the conductor, and shields the magnetic flux density sensors against the electric field of the conductor. The instrument does not store the information with respect to time.

SUMMARY OF THE INVENTION

In accordance with the present invention measurements are made with respect to an energy field over a prolonged period of time, along three orthogonal axes and in different frequency ranges. Such measurements are stored as measured data with respect to time for different spectral bands. The exposure measurements are furthermore made simultaneously with measurement of motion within the energy field being measured.

According to one embodiment of the present invention, the foregoing and additional objects are achieved by providing an electromagnetic field exposure dosimeter. The dosimeter comprises a triaxial ferrite-loaded coil sensor, a group of bandpass filters for each axis, a pair of analog-to-digital (A/D) converters, a microcontroller, a random-access memory (RAM), and a computer. The triaxial sensor measures electromagnetic radiation in three orthogonal axes and sends an electrical signal to the bandpass filters. The bandpass filters separate the signal into three frequency ranges. One frequency range measures exposure at 60 Hz and two of its harmonics. The second range measures high-frequency pulsed energy. The third frequency range measures body motion of an exposed individual.

In accordance with another aspect of the invention, the A/D converters change the filtered signals into digital data. The microcontroller performs certain calculations on the data and transfers the digital data between the A/D converters, the RAM, and the computer including the storage of high frequency energy and body motion data in the RAM while 60 Hz data is delivered to the computer. The computer has a program to read the digital data concerning exposure at 60 Hz, take a square root of this data, perform a Fast Fourier Transform, and display or store this transformed data as a function of frequency and time. The program also directs the computer to access the other data stored in the RAM through the microcontroller and display this data with respect to time.

Additional objects, advantages and novel features of the invention will be set forth in part in the description which follows, and in part will become apparent to those skilled in the art upon examination of the following or may be learned by practice of the invention. The object and advantages of the invention may be realized and attained by means of instrumentalities and combination particularly pointed out in the appended claims.

BRIEF DESCRIPTION OF THE DRAWING

The foregoing aspects and advantages of the present invention will be more fully understood from the following detailed description and from reference to the appended drawing wherein:

FIGS. 3 and 4 are circuit diagrams of certain components of the system depicted in FIGS. 1 and 2 in accordance with the present invention.

DETAILED DESCRIPTION OF THE INVENTION

Figure 1:
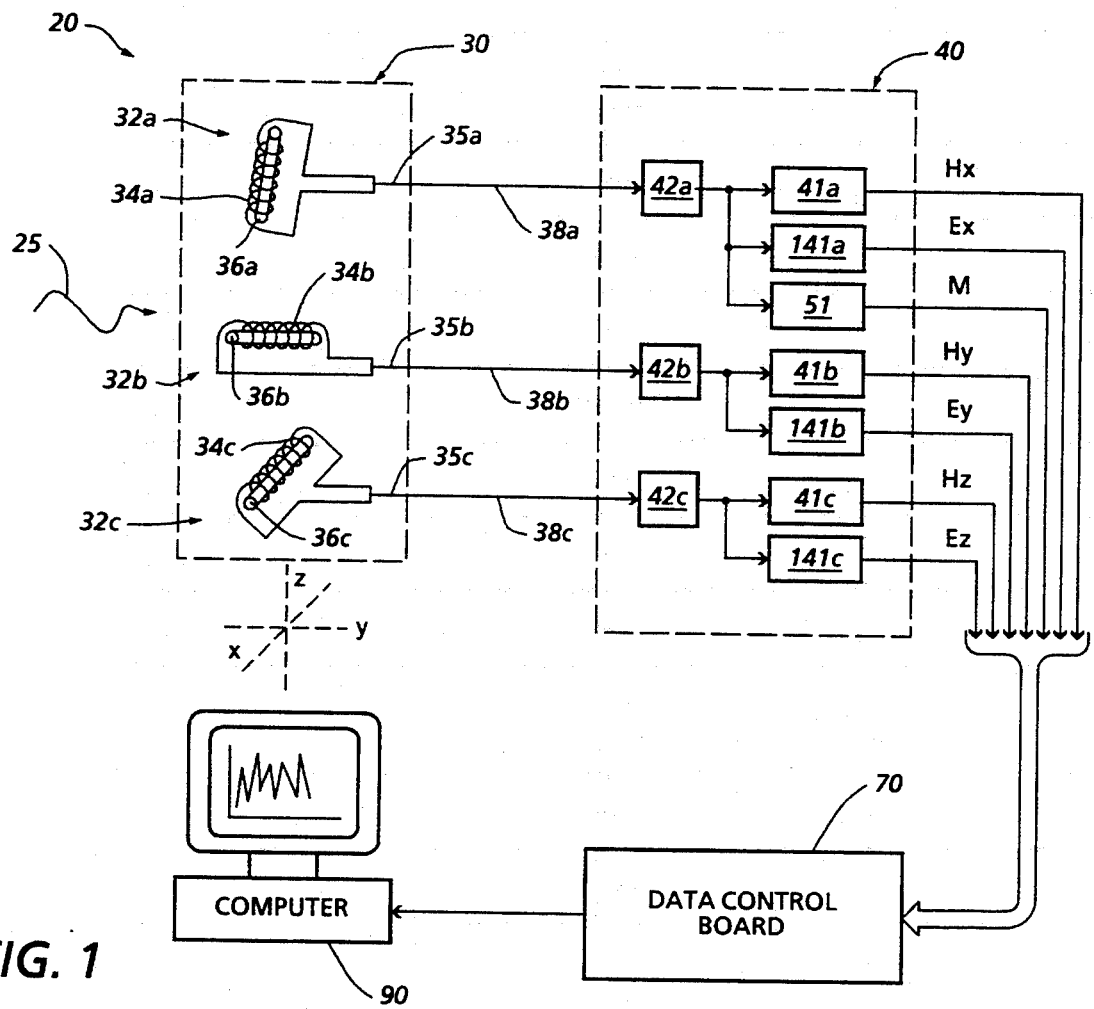
FIG. 1 is a diagram of the components of the electromagnetic field exposure dosimeter system of the present invention.

Referring now to FIG. 1, an electromagnetic field exposure dosimeter 20 according to one embodiment of the present invention comprises a triaxial ferrite-loaded coil sensor 30, an amplifying and filtering circuit 40, a data control board 70, and a microcomputer 90. The dosimeter 20 measures, processes, and stores a person's exposure to ambient field energy in the form of electromagnetic radiation.

The triaxial ferrite-loaded coil sensor 30 comprises three coil transducers 32a, 32b, and 32c. Each transducer 32a, 32b, and 32c is aligned along a different axis, x, y and z, respectively, and each axis x, y, and z is orthogonal to the other two. Each transducer 32a, 32b, and 32c comprises a coil 34a, 34b, and 34c, respectively, which helically surrounds a ferrite bar 36a, 36b, and 36c. The transducers 32a, 32b, and 32c measure electromagnetic radiation 25. The three transducers 32a, 32b, and 32c each sends an electrical signal 35a, 35b, and 35c to the amplifying and bandpass filtering circuit 40 through outputs 38a, 38b, and 38c, respectively.

Figure 2:
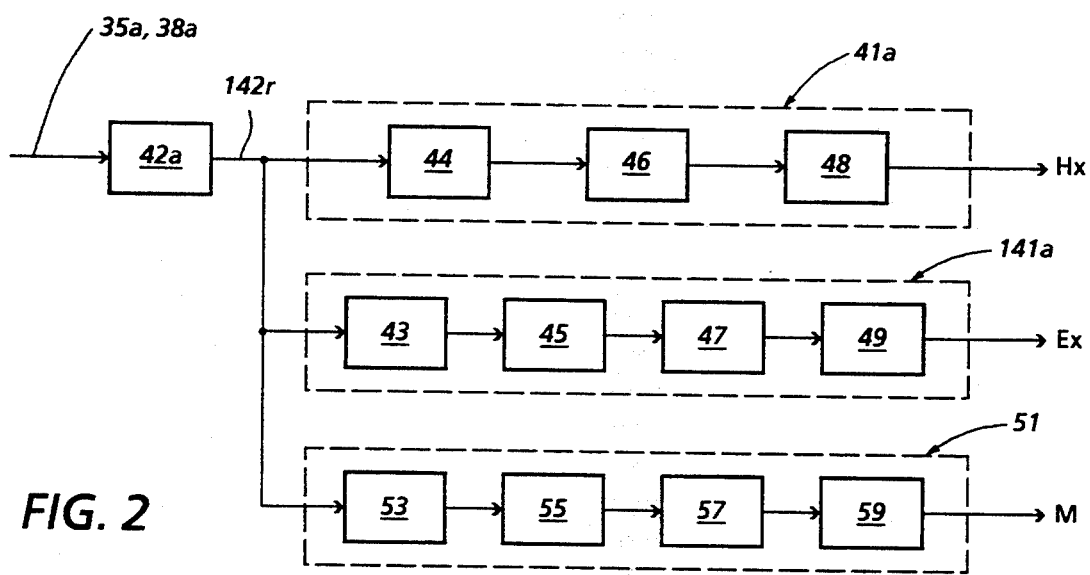
FIG. 2 is a more detailed block diagram of a portion of the system depicted in FIG. 1 in accordance with one embodiment of the present invention.

FIG. 2 illustrates by block diagram the amplifying and filtering circuit 40. The circuit amplifies and filters the transduced signals 35a, 35b, and 35c into two or three frequency ranges. One frequency range is 10 Hertz to 200 Hertz within which exposure to electromagnetic radiation at 60 Hz and its first two harmonics is measured. The second range is between 200 Hertz and 10 kilohertz for high-frequency pulsed electromagnetic energy. The third frequency range is between 0.05 Hertz and 4 Hertz for measurement of body motion of an exposed individual. Preferably, each operational amplifier of the circuit 40 is an Analog Device AD795.

As shown in FIG. 1, the circuit 40 includes an amplifying and filtering stage 42a, 42b, or 42c for each signal 35a, 35b, and 35c respectively. Each signal then passes through two sets of bandpass filter stages, one set being, 41a, 41b, and 41c, the other set being 141a, 141b, and 141c. Additionally, one of the electrical signals 35a, 35b, or 35c passes through a third stage bandpass filter 51. FIG. 2 shows signal 35a branching into the third bandpass filter stage 51, although signal 35b or 35c may alternatively branch into such third bandpass filter stage. Outputs for signal 35a are $H_x$, $E_x$ and M.

Signals 35b and 35c, have amplifying and filtering circuits similar to that for signal 35a. Outputs for signal 35b are $H_y$ and $E_y$, while outputs for signal 35c are $H_z$ and $E_z$ as shown in FIG. 1.

Figure 3:
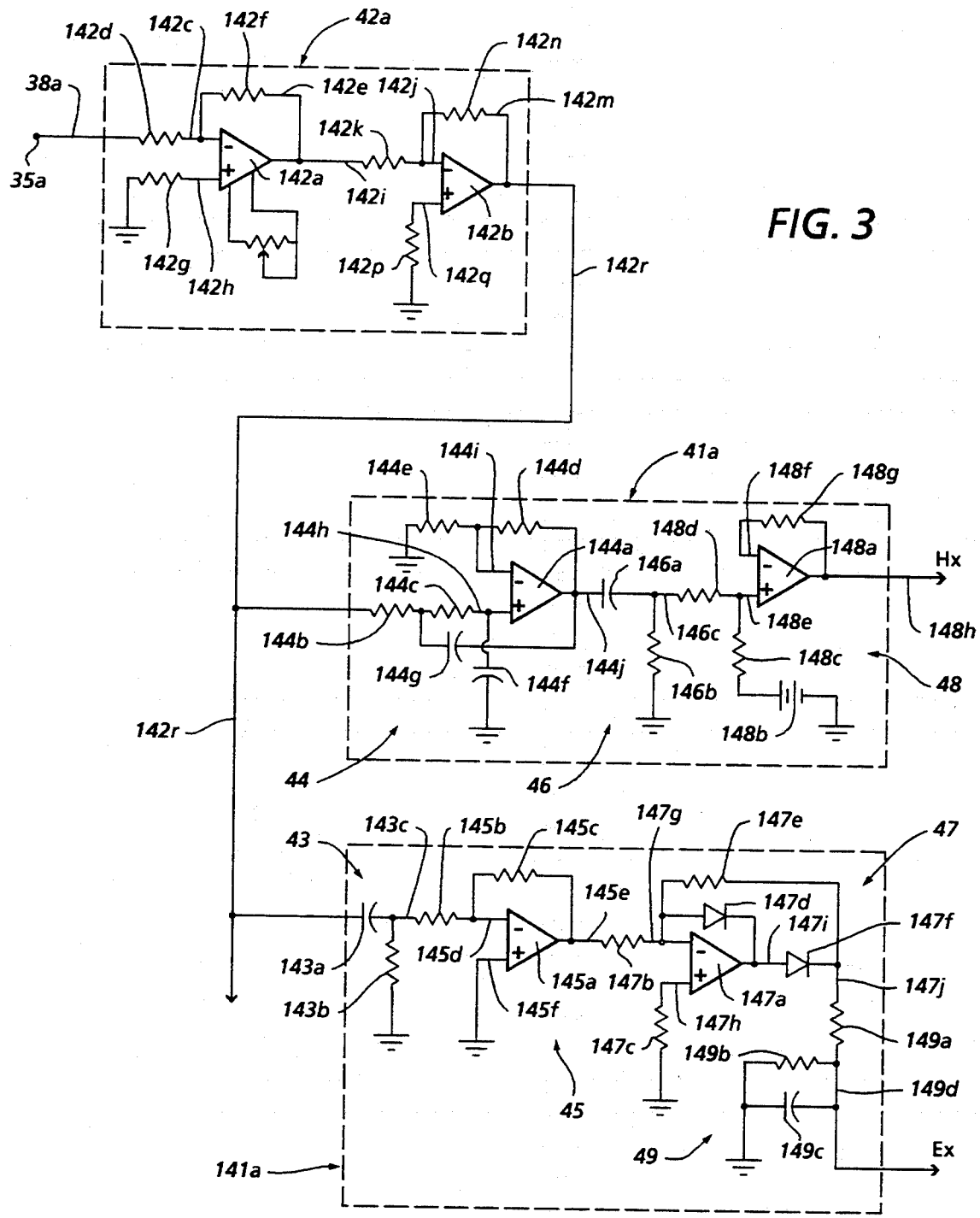

Referring now to FIGS. 2 and 3, the amplifying and filtering circuit includes an amplifying and filtering stage 42a which amplifies the signal 35a in line 38a. The stage 42a comprises two inverting operational amplifiers 142a and 142b connected in cascade. The inverting input 142c of the first stage operational amplifier 142a as shown in FIG. 3 connects to the output 38a of the triaxial sensor through resistor 142d. The first stage operational amplifier 142a also includes a negative feedback branch 142e having a resistor 142f. A third resistor 142g connects in series between a non-inverting input 142h and ground.

The first stage operational amplifier 142a has a gain of 120 and an output 142i which connects to an inverting input 142j of the second stage operational amplifier 142b through resistor 142k. The second stage operational amplifier 142b includes a negative feedback branch 142m using feedback resistor 142n. A resistor 142p connects in series between a non-inverting input 142q and ground. The second stage operational amplifier 142b has an output 142r. The gain of the second-stage operational amplifier 142b is set at 150.

Based on their combined gain and bandwidth, the two operational amplifiers 142a and 142b act as a low-pass filter set at 10 kilohertz. In other words, the filter eliminates frequencies greater than 10 Khz. Preferably, the two operational amplifiers 142a and 142b are Analog Devices AD795 having a terminal frequency or unity-gain bandwidth of 1.5 MHz. After the amplifying and filtering stage 42a, the electrical signal 35a branches into two sets of bandpass filter stages 41a and 141a.

With continued reference to FIGS. 2 and 3, the bandpass filtering stage 41a comprises a two-pole, 200 Hz low-pass active filter 44, a 10 Hz high-pass passive filter 46 and a level shifter 48. The filtering stage 41a filters the electrical signals from the sensor into a frequency range of 10 Hertz to 200 Hertz. This range includes frequencies at 60 Hz, and two of its harmonics—120 Hz, and 180 Hz—which are frequencies covering electromagnetic radiation from household wiring, electrical appliances, and power lines. This range of electromagnetic radiation is the most prevalent, potentially the most harmful, and therefore the most significant to observe.

The two-pole low pass filter 44 comprises an operational amplifier 144a, four resistors 144b—e, and two capacitors 144f and 144g. The filter 44 has a gain of two. The operational amplifier 144a has a non-inverting input 144h, an inverting input 144i, and an output 144j. The non-inverting input 144h connects to the output 142r through resistors 144b and 144c, which are connected in series. Capacitor 144f connects between the non-inverting input 144h and ground. Capacitor 144g connects between the output 144j and between the two resistors 144b and 144c. The resistors 144b and 144c and the capacitors 144f and 144g set the corner frequency of the filter 44. For the circuit given, corner frequency $\omega_0$ is determined from the formula:

$$\omega_o = \frac{1}{\sqrt{R_{(144b)} * R_{(144c)} * C_{(144f)} * C_{(144g)}}}$$

where
$R_{(144b)}$ = resistance of resistor 144b
$R_{(144c)}$ = resistance of resistor 144c
$C_{(144f)}$ = capacitance of capacitor 144f
$C_{(144g)}$ = capacitance of capacitor 144g The resistor 144d connects the output 144j and the inverting input 144i. The resistor 144e connects the inverting input 144i and ground. Gain of the amplifier, G, is determined by:

$$G = 1 + \frac{R_{(144d)}}{R_{(144c)}}$$

Varying the gain will vary the damping ratio.

The high-pass filter 46 is passive and comprises a capacitor 146a and a resistor 146b. The capacitor 146a is connected in series with the output 144j. The resistor 146b connects an output 146c to ground. The filter 46 reduces signals below 10 Hz. Additional 10 Hz high pass filtering may be helpful. Additionally, the largest measured signals should oscillate between ±5 Volts.

The level shifter 48 shifts the signal level to a voltage range which the data control board can handle by converting the ±5 signal to a 0—5V signal. The level shifter 48 comprises a summing operational amplifier 148a which adds the signal in output 146c to a positive 4.5V reference signal from source 148b. The resistors 148c, 148d, and 146b divide the reference signal from source 148b by approximately two. Resistors 148c and 148d also divide the input signal by two before both divided signals connect to a non-inverting input 148e. A resistor 148g connects an inverting input 148f and an output 148h of the operational amplifier 148a. The gain of the circuit 48 is 1. The output 148h sends signals $H_x$ to the data control board for further processing. $H_x$ represents magnitude of exposure to electromagnetic radiation along the x-axis, measured on volts for frequencies ranging between 10 Hz and 200 Hz. $H_y$ and $H_z$, which are the signal outputs of filtering stages 41b and 41c of FIG. 1, represent magnitude of exposure to electromagnetic radiation along the y-axis and z-axis, respectively, and are measured in similar traits for the same frequency range.

The bandpass filtering stage 141a as diagrammed in FIG. 2 comprises a high-pass filter 43, an amplifying stage 45, a precision half-wave rectifier 47, and an energy storage 49. The filtering stage 141a filters the electrical signals of the sensor into a second frequency range of 200 Hertz to 10 kilohertz. This range of frequency covers high-frequency, pulsed electromagnetic radiation resulting from lightning, from turning an electrical switch off or on, and from other sources having a high rise time and short duration. The dosimeter thereby measures the high-frequency components and sums the total energy in this transient electromagnetic radiation band.

The high-pass filter 43 as diagrammed in FIG. 3 is passive and comprises a capacitor 143a and a resistor 143b. The capacitor 143a connects in series to the output 142r. The resistor 143b connects an output 143c of the capacitor 143a to ground. The filter 43 reduces signals below 200 Hz from the amplifier stage 42a through which signals above 10 KHz were eliminated.

After the filter 43, signal 35a passes through amplifying stage 45, which comprises an inverting operational amplifier 145a and two resistors 145b and 145c. The resistor 145b connects the output 143c to an inverting input 145d. The resistor 145c connects the inverting input 145d to an output 145e of the operational amplifier. A non-inverting input 145f connects to ground. Amplifying stage 45 is placed after filter 43 to reduce noise and remove possible direct-current (DC) offset level problems.

The precision half-wave rectifier 47 comprises an operational amplifier 147a, three resistors 147b, and two diodes 147d and 147f. The rectifier 47 is inverting, operates linearly and acts as a diode with zero forward voltage drop. The resistor 147b connects between the output 145e and an inverting input 147g. Resistor 147c connects between a non-inverting input 147h and ground. Diode 147d is connected between the output 147i amplifier 147a and its inverting input 147g connected to the anode of the diode 147d. Diode 147f connects in series with the output 147i, with its cathode being connected to output 147j. Resistor 147e connects between the inverting input 147g and the output 147j. The resistors 147b and 147e set the gain of the rectifier 47.

After the half-wave rectifier 47, signal 35a passes through the energy storage 49, which comprises two resistors 149a and 149b and a capacitor 149c. The resistor 149a connects in series between output 147j and output 149d. Resistor 149b and capacitor 149c are connected in parallel between output 149d and ground. The RC rise time constant for the capacitor 149c is calculated with resistors 149a and 149b in parallel at a value approximated by resistor 149b.

The energy storage 49 is a low-pass filter which basically acts as an integrator and stores the positive energy in the high frequency signals. During high signal activity, voltage on capacitor 149c rises. During low signal activity, voltage decays. The rise and fall time constant of the storage 49 is approximately 5 seconds. Accordingly, a sampling rate of 0.2 Hz is particularly advantageous.

The output 149d sends signal $E_x$ to the data control board for further processing. $E_x$ represents magnitude of exposure to electromagnetic radiation along the x-axis in frequencies ranging between 200 Hz and 10 kHz. $E_y$ and $E_z$, which are respectively the outputs of filtering stages 141b and 141c in FIG. 1, represent magnitude of exposure to electromagnetic radiation along the y-axis and z-axis, respectively, each measuring frequencies ranging between 200 Hz and 10 kHz.

Figure 4:
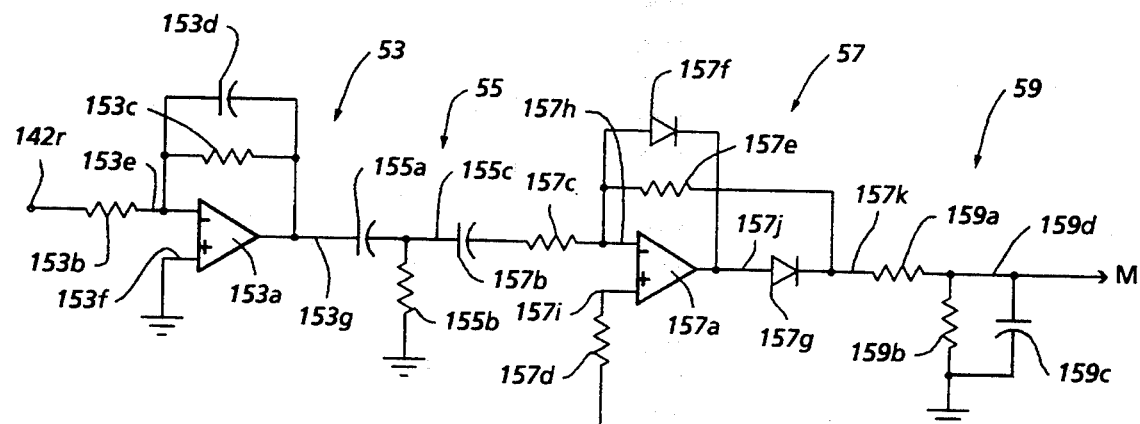

Bandpass filtering stage 51 as shown in FIGS. 2 and 4 comprises a low-pass filter 53, a high-pass filter 55, a precision half-wave rectifier 57 and energy storage 59. The filtering stage 51 filters the electrical signal of only one axis (such as the x-axis) from the sensor into a frequency range of 0.05 Hertz to 4 Hertz. The foregoing range covers body motion, which according to past studies is typically below 2 to 3 Hz, for a person performing normal activities. The filtering stage 51 thus helps correlate a person's activity level to health and electromagnetic field exposure.

The low-pass filter 53 of stage 51 comprises an operational amplifier 153a, two resistors 153b and 153c, and a capacitor 153d. The resistor 153b connects between the output 142r and an inverting input 153e. Resistor 153c and capacitor 153d connect between inverting input 153e and output 153g and are in parallel. Non-inverting input 153f connects to ground. The filter 53 eliminates signals above 4 Hz.

After filter 53, the electrical signal 35a passes through high-pass filter 55. Filter 55 is passive and comprises a capacitor 155a having an output 155c and a resistor 155b. The capacitor 155a connects in series to the output 153g, while the resistor 155b connects between the output 155c and ground. The filter 55 eliminates signals below 0.05 Hz.

Half-wave rectifier 57 as shown in FIG. 4 is similar to rectifier 47 shown in FIG. 3, but includes an additional coupling capacitor 157b. Specifically, rectifier 57 also includes an operational amplifier 157a, three resistors and two diodes 157f and 157g. As with rectifier 47, rectifier 57 acts as a diode with zero voltage drop. The capacitor 157b and resistor 157c are connected in series between the output 155c and an inverting input 157h. Resistor 157d is connected between a non-inverting input 157$i$ and ground. Diode 157$f$ is connected between an output 157$j$ and inverting input 157$h$. Diode 157$g$ has an output 157$k$ and connects in series with the output 157$j$. Resistor 157$e$ is connected between the inverting input 157$h$ and the output 157$k$. Gain of rectifier 57 is set at 15.

After the half-wave rectifier 57, signal 35$a$ passes through the energy storage 59, which is similar to energy storage 49 and comprises two resistors 159$a$ and 159$b$ and a capacitor 159$c$. The resistor 159$a$ connects in series with the diode 157$g$ and has an output 159$d$. Resistor 159$b$ and capacitor 159$c$ are in parallel and connect between output 159$d$ and ground. The output 159$d$ sends a signal M to the data control board for processing. M represents the activity level along one of the three axes, measured in volts, of a person wearing the dosimeter. Like storage 49, energy storage 59 is a low-pass filter which basically acts as an integrator and stores the energy of the frequency signals. Again, a sampling rate of 0.2 Hz is particularly advantageous.

Figure 5:
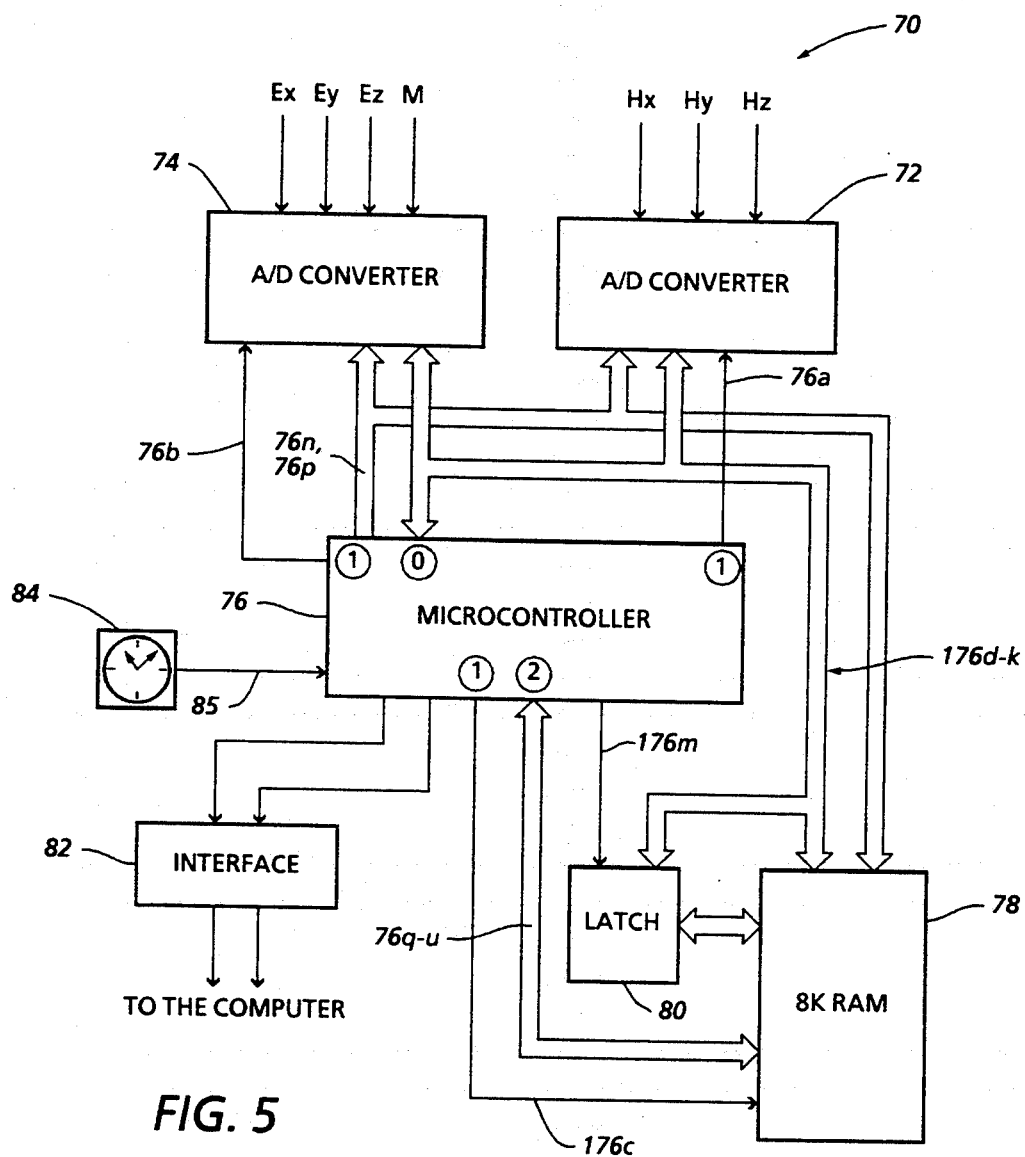
FIG. 5 is a block diagram of a data control board of the invention depicted in FIG. 1.
Figure 6A:
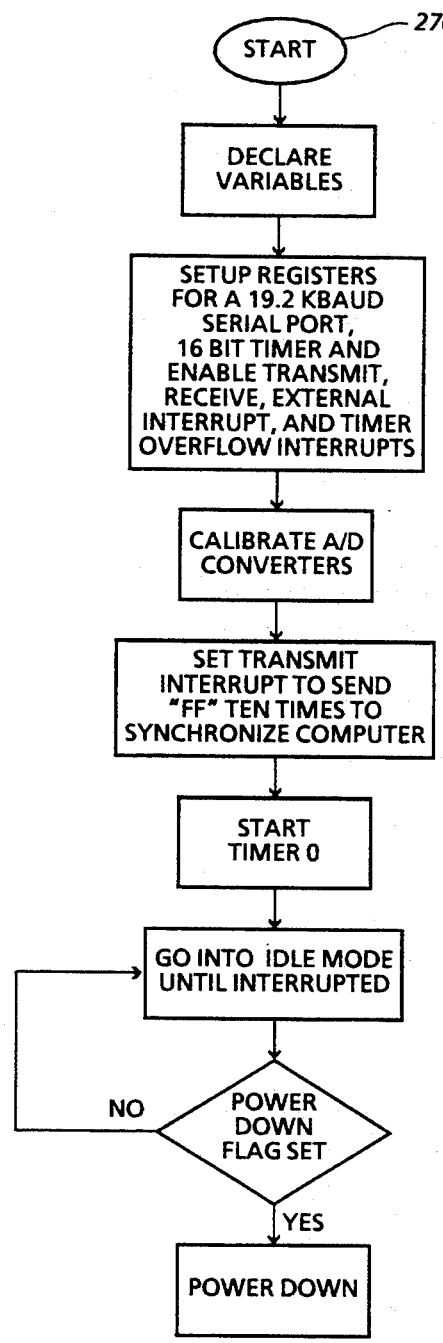
FIG. 6(A), 6(B), 6(C), 6(D) and 6(E) are flow charts describing an assembly code program for the microcontroller component depicted in FIG. 5 in accordance with the present invention.
Figure 6B:
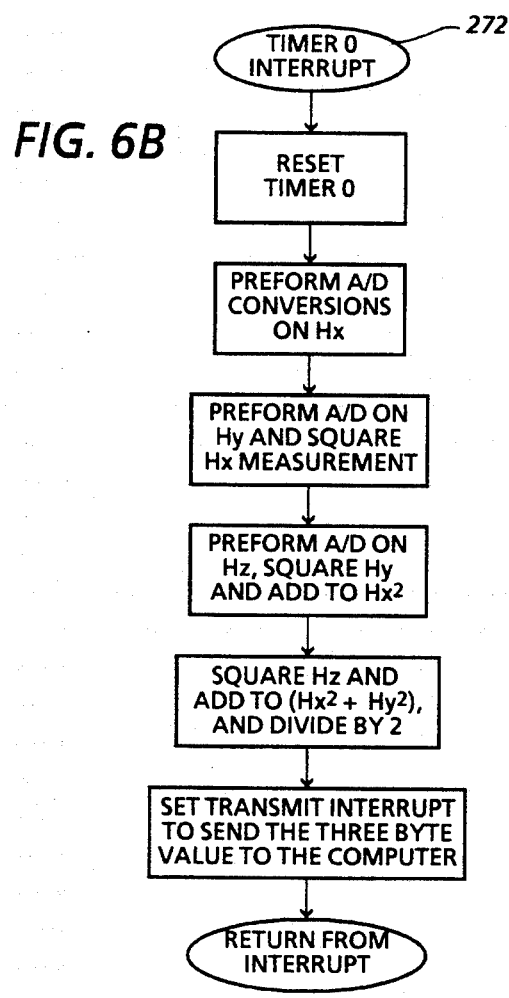
Figure 6D:
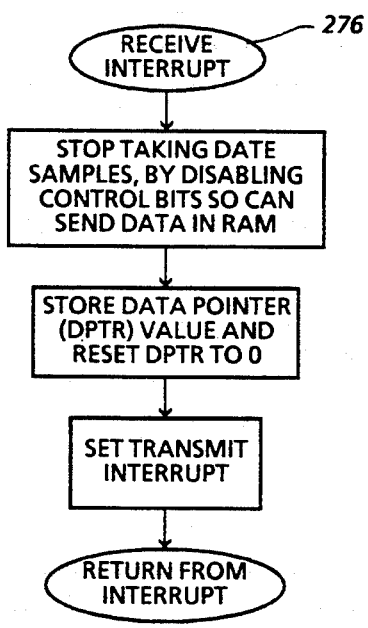
Figure 6E:
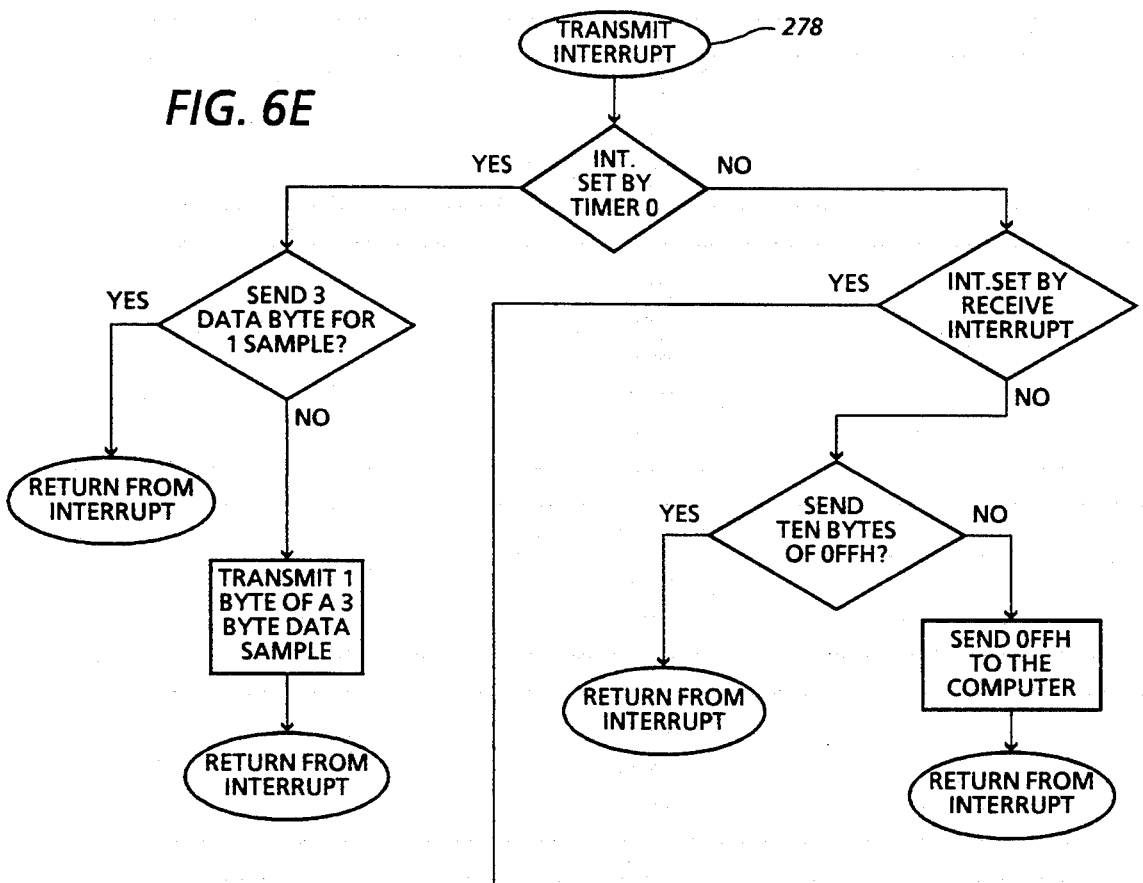
Figure 6C:
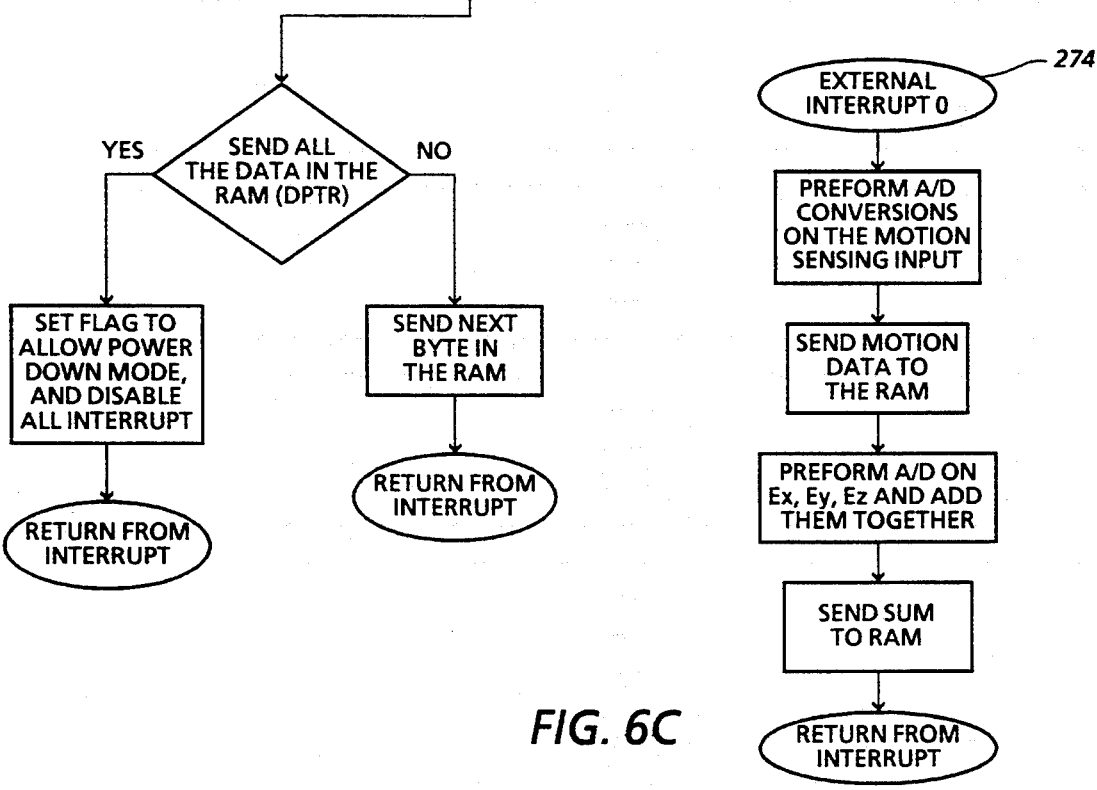

FIG. 5 illustrates a block diagram of the data control board 70. The data control board 70 converts the output signals $H_x$, $H_y$, $H_z$, $E_x$, $E_y$, $E_z$ and M from the amplifying and filtering circuit 40 into digital data and then transfers the digital data to the computer 90. The data control board 70 comprises two analog-to-digital (A/D) converters 72 and 74, a microcontroller 76, a random-access memory (RAM) 78, a latch 80, a serial interface 82, and a clock 84. The A/D converter 72 receives the signals $H_x$, $H_y$, and $H_z$ from the amplifying and filtering circuit 40 while A/D converter 74 receives signals $E_x$, $E_y$, $E_z$, and M. Both converters 72 and 74 are 12 bit 4-channel A/D converters such as the ADS 7803. Inputs to the converters 72 and 74 must be between 0 V and 5 V for proper operation. Each converter runs at 1 MHz and can perform an A/D conversion in 20 microseconds.

The microcontroller 76 is preferably an INTEL 87C51 which uses an 11.0592 MHz crystal. This crystal allows a baud rate of 19,200 baud to be used on its serial port. The crystal also enables the microcontroller to perform an instruction in only 1or 2 microseconds. The microcontroller 76 thus controls the timing of A/D conversions, performs calculations on data and controls data flow with respect to the latch 80, the converters 72 and 74, the RAM 78, and the serial interface 82 which is connected to the computer.

The microcontroller 76 has three pins on port 1 which serve as chip select lines 176$a$, 176$b$, and 176$c$ connected to the converter 72, the converter 74, and the RAM 78, respectively. The chip select lines determine whether the converter 72, the converter 74, or the RAM 78 will be accessed. The microcontroller 76 also has eight address/data lines 176$d$–$k$ on port 0 which connect to the converters 72 and 74, the RAM 78, and the latch 80. Such address/data lines 176$d$–$k$ are time multiplexed to carry an address and data. A pull-up resistor pack properly loads the bus for port 0 because port 0 has open drain outputs.

The latch 80 is an 8-bit, tri-state, D-type latch, such as a 74HC373. An 8-bit address is placed on the input pins of the latch, and when a latch enable pulse is received on line 176 m, the address is placed on the output pins of the latch and held there until another address is latched in or until the latch is disabled. The latch enable line 176 m interconnects the microcontroller 76 with the latch 80. Microcontroller 76 also has two pins for read and write lines 176$n$ and 176$p$, which connect to read and write lines on the converters 72 and 74 and to output enable and write lines on the RAM 78. For 16-bit addresses, the microcontroller uses the lower five bit pins on port 2 which serve as high-byte address lines 176$q$–$u$. These lines are connected to the highest five bits of the RAM 78.

The RAM 78 is an 8 Kbyte $\times$ 8 bit device, such as the HM6264, which uses 13 address lines and 8 data lines: for external data read and write operations, the microcontroller 76 sends out a 13 bit address. The low-byte 8 bits of the address for the RAM is captured and held in the latch 80. The high 5 bits are connected directly to the RAM 78 and upon receipt of a latch enable pulse the low byte address is connected to the low-byte address input of the RAM. For write operations, the microcontroller 76 then puts data on the address/data lines, and a write signal is sent through line 176$n$ to the write pin on the RAM. Read operations are similar to write operations, except that a read signal from the microcontroller is sent through line 176$p$ to the output enable pin on the RAM, and the RAM then sends data to the microcontroller.

When the microcontroller 76 signals the converter 72 or 74 to begin a conversion, the latch 80 holds the address, which is actually high byte enable and special function register control lines for the converter 72 or 74. A data byte is then sent from the microcontroller 76, which contains two bits for selecting the input channel, $H_x$, $H_y$ or $H_z$, for 72 and $E_x$, $E_y$, $E_z$ or M for 74. The two lowest data bits of the converter connect to its channel select pins. The converter 72 or 74 produces a 12-bit number from the analog input, which the microcontroller 76 reads with two read operations. The latch 80 holds the value applied to the high-byte enable (HBE) pin while data is read from the converter 72 or 74 with two read operations and sent to the microcontroller.

When a microcontroller 76 internal 16-bit timer, set for 514 Hz, overflows, the microcontroller 76 samples the three inputs $H_x$, $H_y$, and $H_z$ going to converter 72. This sampling rate is more than double the 200 Hz bandwidth of the sampled signal. Thus, the sampling rate is more than double the Nyquist rate. The converter 72 produces a 12-bit number for each signal $H_x$, $H_y$, or $H_z$. The microcontroller 76 squares each 12-bit digit, adds the three squared numbers together, and then divides the summed value by two to give a 24-bit result ($H_{TOTAL}$)$^2$. Such data is then sent directly to the computer 90 for processing. The equation for ($H_{TOTAL}$)$^2$ is $$(H_{TOTAL})^2 = \frac{H_x^2 + H_y^2 + H_z^2}{2}$$

The equation for $H_{TOTAL}^2$ includes a divide by two so that the resulting $H_{TOTAL}^2$ will fit into a 24 bit binary value. The value $H_{TOTAL}$, which represents the total exposure to electromagnetic radiation, is calculated later when the computer takes the square root of ($H_{TOTAL}$)$^2$.

The serial interface 82 interconnects the serial port transmit and receive lines from the microcontroller 76 with the computer 90. The interface 82, which is preferably a MAX 232 chip, converts a 0–5 V TTL signal into a $\pm$15 V RS-232 signal and a $\pm$15 V signal to 0–5 V. The interface 82 is the driver for the line to the computer's serial port.

The clock 84 is connected to the microcontroller 76 through an external interrupt (INT0) pin 85. The clock 84 sends an interrupt signal to the microcontroller every five seconds.

When the microcontroller 76 observes the external interrupt signal from the clock 84 which is set for 0.2 Hz, the microcontroller samples the four inputs $E_x$, $E_y$, $E_z$, and M going to converter 74. The microcontroller then adds the inputs $E_x$, $E_y$, and $E_z$ together to obtain $E_{TOTAL}$ and sends the added number for storage in the RAM 78. The input M is sampled and sent directly to the RAM 78. The samples of $E_{TOTAL}$ and M are each stored as two bytes because they are 12-bit numbers.

At the end of the measuring period, a word is sent from the computer to the microcontroller. When the microcontroller receives this word, the microcontroller stops taking samples and sends the data in the RAM to the computer via the serial port. After all data is sent, the microcontroller shuts itself off.

FIG. 6A, FIG. 6B, FIG. 6C, FIG. 6D and FIG. 6E illustrate a flow chart for an assembly code program to instruct the microcontroller 76 to perform the functions just described. The main routine 270 sits in the idle mode until the microcontroller receives an interrupt signal. Flowcharts 272, 274, 276, and 278 represent four different interrupt routines that the program performs depending on the interrupt signal received by the microcontroller. Ten bytes of #OFFH, which represents a byte of "ones" only, synchronize the microcontroller with the computer.

Figure 7:
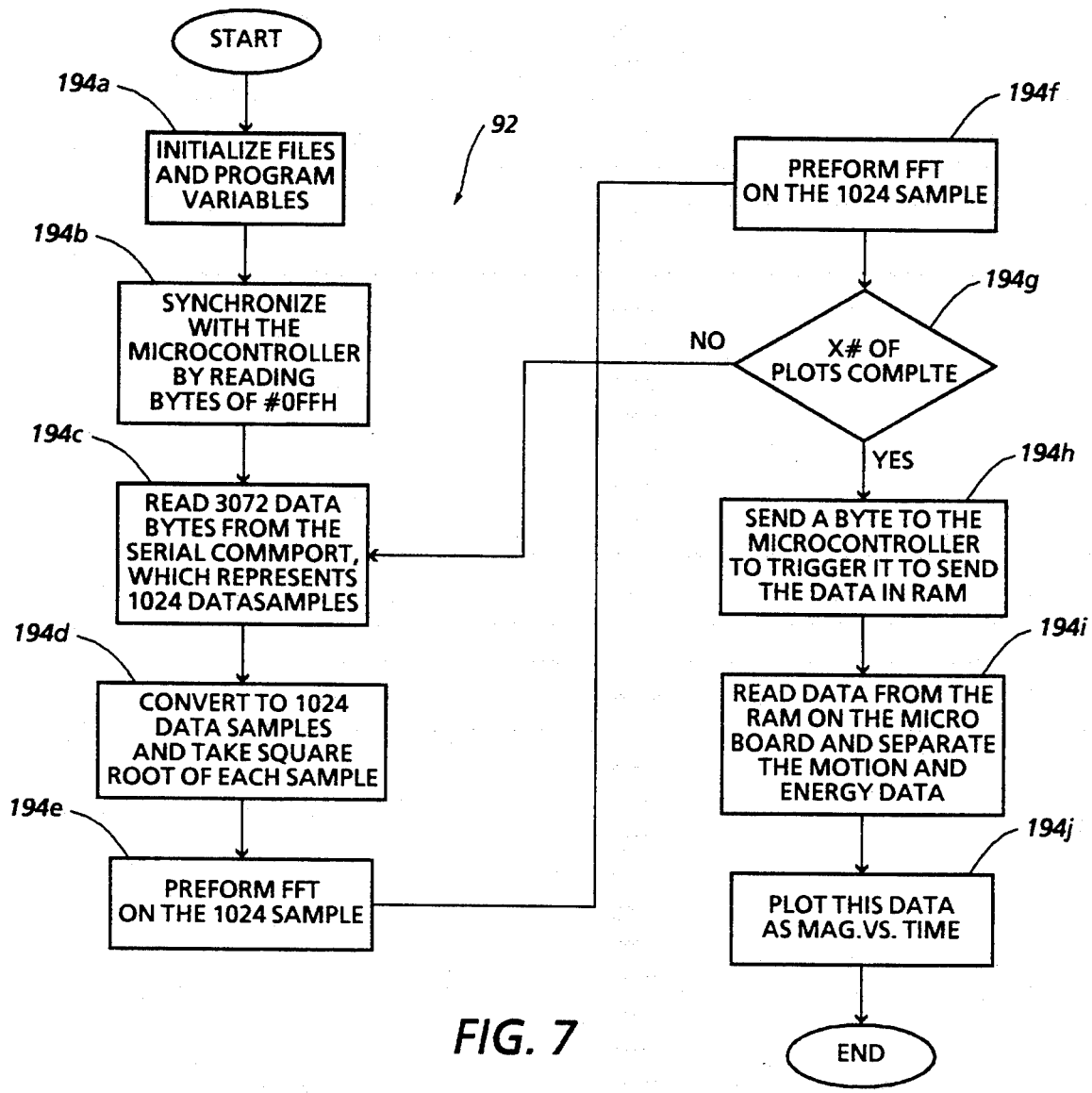
FIG. 7 is a flowchart illustrating a software program in the computer for analyzing data measured by the invention.

Referring once again to FIG. 1, the computer 90 processes, analyzes, and displays the digital data transmitted from the data control board 70. FIG. 7 illustrates a flowchart 92 for a data collection program in accordance with the present invention. The program begins with the step 194a by initializing files and program variables. The program then performs the step 194b of synchronizing the microcontroller 76 with the computer 90. Next, the computer reads and stores in a buffer, step 194c, the data samples of $(H_{TOTAL})^2$.

Once the computer receives 1024 samples, which is 3072 data bytes, the program commands the computer to take a square root of each data sample, step 194d, and store the value in an array. The resulting array represents the total exposure to electromagnetic radiation in the 60 Hz range of frequency for 1024 data samples obtained during a sampling interval of approximately 2 seconds. The computer then performs a Fast Fourier Transform (FFT), step 194e, on the 1024 square-rooted samples. The transformed data reflects an array which contains the major frequency components measured by the triaxial sensor.

The program's next step, 194f, plots the transformed data as a function of frequency. The plot enables the data to be continually analyzed. Because the FFT gives both the positive and negative frequency components, the program ignores the negative components during the plotting. After plotting the frequency information for a 1024 data sampling set, the program decides in step 194g whether to return to the step 194c of reading and storing more 60 Hz data or read the energy data in the RAM.

Although the program diagrammed in FIG. 7 plots the FFT data as magnitude versus frequency, the program data may be plotted in other beneficial configurations such as frequency versus time. Additionally, the program may be modified to store the FFT data in the computer's memory for later analysis.

After completing the plotting subroutine for $H_{TOTAL}$ values, the program's next step 194h is sending an interrupt byte to the microcontroller. The program then commands the computer in step 194i to read the signals $E_x$, $E_y$, $E_z$ and M from the RAM. The computer then separates the high-energy data from the motion data. Next, the program plots this data $E_{TOTAL}$ and M, step 194j, in separate graphs, as a function of time. Alternatively, the program simply stores the data in memory. After this point, the program terminates.

It will be apparent from the foregoing description that this invention features the combination of triaxial sensor 30 with amplifying and filtering circuit 40 which filters transduced electromagnetic radiation into three predetermined frequency ranges. Also microcontroller 76 functions to control sampling time of the A/D converters 72 and 74, perform calculations on the data from the converters and control flow of data between the converters, RAM and computer. Further, exposure data is stored with respect to activity level and time to correlate health effects and fitness with exposure. Other features of the invention include a data processing program for controlling computer 90 to analyze digital data on electromagnetic radiation and to plot the exposure to such electromagnetic radiation over an extended period of time.

The advantages of this invention include the ability to measure exposure to electromagnetic radiation over a prolonged period and the ability to measure exposure to electromagnetic radiation and motion of an individual exposed to electromagnetic radiation simultaneously. Other advantages include filtering data on exposure to electromagnetic radiation into notably different frequency ranges.

In accordance with another aspect of the invention, the dosimeter comprises a triaxial ferrite-loaded type coil sensor and, an A/D converter, a digital-signal processing chip and/or microcontroller, and an external random access data memory. The sensor measures electromagnetic radiation in three orthogonal axes and sends an amplified and filtered electrical signal to the A/D converter, which converts the signal into digital code. Low pass signal filtering will be required to prevent aliasing. The digital-signal processing chip or microcontroller filters the code into three frequency ranges. One range measures exposure at 60 Hz and at least one of its harmonics. The second range measures high-frequency pulsed energy. The third frequency range measures body motion of an exposed individual. After filtering the data into the three frequency ranges and computing the total field measurements, the chip performs a Fast Fourier Transform on the data in the 60 Hertz frequency range. The chip then sends the transformed data for storage in the dosimeter memory. The total high frequency energy data and motion data would also be stored in the dosimeters' on board memory, as well. Such an embodiment would be in the form of a small, portable, battery powered, stand alone unit that could be worn or carried by the individual for prolonged periods of time, say, 24 or 48 hours. The individual would be able to go about the day performing normal activity while measurements are being taken with respect to the electromagnetic radiation to which the individual is being exposed. A computer could then be connected to the dosimeter unit at regular intervals, say every evening, in order to retrieve the data in the units memory. The computer would then correlate the high frequency and activity data with the data from the FFT. The data so stored in the memory could be displayed in a variety of formats. Alternatively, the unit could be attached to animals or to machines to obtain data without modification of the unit.

Numerous other modifications and variations of the present invention are possible in light of the foregoing teachings including the monitoring of human exposure to conditions other than electromagnetics radiation, such as acoustic noise, seismic noise, chemicals air quality and radiation in general with respect to time and position. It is therefore to be understood that, within the scope of the appended claims, the invention may be practiced other than as specifically described.

What is claimed is:

1. Apparatus for monitoring and analyzing exposure to ambient energy, including: sensor means for measurement of the ambient energy along plural axes, amplifier means connected to the sensor means for processing said measurement of the ambient energy as electrical signals generated along said axes within different frequency ranges respectively corresponding to exposure of the sensor means within a field of the ambient energy, bandpass filter means connected to the amplifier means for simultaneously channeling the electrical signals processed by the amplifier means within the different frequency ranges; and data processing means connected to the bandpass filter means for correlating the processed electrical signals simultaneously channeled by the bandpass filter means into exposure data respectively corresponding to the different frequency ranges associated with said field of the ambient energy, said amplifier means comprising two series connected low pass amplifying filters through which the electrical signals from the sensor means is processed, said bandpass filter means comprising: two high pass filter stages through which the processed electrical signals within two of the different frequency ranges are respectively channeled to the data processing means from the amplifier means, a third high pass filter stage connected to the data processing means and a low pass filter stage connected in series between said third high pass filter stage and the amplifier means through which the processed electric signals within a third of the different frequency ranges is channeled to the data processing means.

2. Apparatus for monitoring and analyzing exposure to ambient energy, including: sensor means for measurement of the ambient energy along plural axes, amplifier means connected to the sensor means for processing said measurement of the ambient energy as electrical signals generated along said axes within different frequency ranges respectively corresponding to exposure of the sensor means within a field of the ambient energy, bandpass filter means connected to the amplifier means for simultaneously channeling the electrical signals processed by the amplifier means within the different frequency ranges; and data processing means connected to the bandpass filter means for correlating the processed electrical signals simultaneously channeled by the bandpass filter means into exposure data respectively corresponding to the different frequency ranges associated with said field of the ambient energy, said bandpass filter means comprising two high pass filter stages through which the processed electrical signals within two of the different frequency ranges are respectively channeled to the data processing means from the amplifier means, a third high pass filter stage connected to the data processing means and a low pass filter stage connected in series between said third high pass filter stage and the amplifier means through which the processed electric signals within a third of the different frequency ranges is channeled to the data processing means.

3. A radiation dosimeter comprising:

transducer means responsive to ambient electromagnetic radiation for producing an electrical signal, including three ferrite-core coil sensors; and circuit means connected to said coil sensors for amplifying and filtering the electrical signal within three predetermined frequency ranges of radiation exposure respectively measuring high frequency at 60 Hertz, pulse radiation characteristic and human body motion, said circuit means including:
- a first low-pass amplifying filter connected to the coil sensors;
- a second low-pass amplifying filter connected to the first low-pass amplifying filter;
- a first high-pass filter connected to the second low-pass amplifying filter;
- a second high-pass filter connected to the first low-pass amplifying filter;
- a third low-pass filter connected to the first low-pass amplifying filter; and
- a third high-pass filter connected to the third low-pass filter.

* * * * *